… …

United States Patent [19]
Mak et al.

[11] Patent Number: 6,162,715
[45] Date of Patent: Dec. 19, 2000

[54] METHOD OF FORMING GATE ELECTRODE CONNECTION STRUCTURE BY IN SITU CHEMICAL VAPOR DEPOSITION OF TUNGSTEN AND TUNGSTEN NITRIDE

[75] Inventors: Alfred Mak, Union City; Kevin Lai, Santa Clara; Cissy Leung, Fremont; Steve G. Ghanayem, Sunnyvale, all of Calif.; Thomas Wendling, Hannover, Germany; Ping Jian, San Jose, Calif.

[73] Assignee: Applied Materials, Inc., Santa Clara, Calif.

[21] Appl. No.: 09/114,839

[22] Filed: Jul. 14, 1998

Related U.S. Application Data

[63] Continuation-in-part of application No. 08/884,811, Jun. 30, 1997.

[51] Int. Cl.$^7$ ............................................. H01L 21/3205
[52] U.S. Cl. ........................ 438/592; 438/653; 438/656; 438/680
[58] Field of Search ..................... 438/585, 586, 438/592, 653, 656, 680; 257/412, 763, 764

[56] References Cited

U.S. PATENT DOCUMENTS

| | | | |
|---|---|---|---|
| 4,436,761 | 3/1984 | Hayashi et al. | 427/38 |
| 4,713,259 | 12/1987 | Gartner et al. | 427/39 |
| 4,745,031 | 5/1988 | Nakayama et al. | 428/433 |
| 4,766,006 | 8/1988 | Gaczi | 427/38 |
| 4,894,256 | 1/1990 | Gartner et al. | 427/39 |
| 4,913,929 | 4/1990 | Moslehi et al. | 427/39 |
| 4,965,090 | 10/1990 | Gartner et al. | 427/39 |

(List continued on next page.)

FOREIGN PATENT DOCUMENTS

| | | | |
|---|---|---|---|
| 0 299 245 A1 | 1/1989 | European Pat. Off. | C23C 16/34 |
| 0 324 523 A2 | 7/1989 | European Pat. Off. | C23C 16/50 |
| 0 630 989 A2 | 12/1994 | European Pat. Off. | C23C 16/44 |
| 0 840 363 A1 | 5/1998 | European Pat. Off. | H01L 21/285 |
| 0 847 082 A2 | 6/1998 | European Pat. Off. | H01L 21/306 |
| 56-156760 | 3/1981 | Japan | C23C 13/02 |
| 63-317676 | 12/1988 | Japan | C23C 16/50 |
| 1-005015 | 1/1989 | Japan | H01L 21/285 |

(List continued on next page.)

OTHER PUBLICATIONS

Nakajima, T., et al., Preparation of Tungsten Nitride Film by CVD Method Using $WF_6$, J. Electrochemical Society: Solid–State Science and Technology, pp.3175–3178, Dec. 1987, 134(12).

Kim, Y. T., et al, "New Method to Supress encroachment by Plasma–Deposited Beta–Phase Tungsten Nitride Thin Films", Appl. Phys. Lett., vol.59, No.8, pp. 929–931, Aug. 1991.

Marcus, S. D. et a., "Characterization of Low Pressure Chemically Vapor–Deposited Tungsten Nitride Films", Thin Solid Films, pp.330–333, 1993.

(List continued on next page.)

*Primary Examiner*—T. N. Quach
*Attorney, Agent, or Firm*—Thomason, Moser & Patterson

[57] ABSTRACT

A gate electrode connection structure formed by deposition of a tungsten nitride barrier layer and a tungsten plug, where the tungsten nitride and tungsten deposition are accomplished in situ in the same chemical vapor deposition (CVD) chamber. The tungsten nitride deposition is performed by plasma enhanced chemical vapor deposition (PECVD) using a plasma containing hydrogen, nitrogen and tungsten hexafluoride. Before deposition the wafer is pretreated with a hydrogen plasma to improve adhesion. The tungsten deposition process may be done by CVD using tungsten hexafluoride and hydrogen. A tungsten nucleation step is included in which a process gas including a tungsten hexafluoride, diborane and hydrogen are flowed into a deposition zone of a substrate processing chamber. Following the nucleation step, the diborane is shut off while the pressure level and other process parameters are maintained at conditions suitable for bulk deposition of tungsten.

34 Claims, 10 Drawing Sheets

U.S. PATENT DOCUMENTS

| | | | |
|---|---|---|---|
| 5,011,705 | 4/1991 | Tanaka | 427/39 |
| 5,132,756 | 7/1992 | Matsuda | 257/412 |
| 5,135,775 | 8/1992 | Foller et al. | 427/38 |
| 5,232,872 | 8/1993 | Ohba | 437/192 |
| 5,283,085 | 2/1994 | Gartner et al. | 427/534 |
| 5,306,666 | 4/1994 | Izumi | 437/192 |
| 5,487,923 | 1/1996 | Min et al. | 427/569 |
| 5,576,071 | 11/1996 | Sandhu | 427/534 |
| 5,670,808 | 9/1997 | Nishhori et al. | 257/310 |
| 5,710,070 | 1/1998 | Chan | 438/21 |
| 5,716,870 | 2/1998 | Foster et al. | 438/653 |
| 5,719,410 | 2/1998 | Suehiro et al. | 257/77 |
| 5,733,816 | 3/1998 | Iyer et al. | 438/592 |
| 5,744,398 | 4/1998 | Wanlass | 438/218 |
| 5,780,908 | 7/1998 | Sekiguchi et al. | 257/383 |
| 5,786,256 | 7/1998 | Gardner et al. | 438/305 |
| 5,913,145 | 6/1999 | Lu et al. | 438/643 |
| 5,925,918 | 7/1999 | Wu et al. | 257/413 |
| 5,962,904 | 10/1999 | Hu | 257/412 |
| 6,015,727 | 1/2000 | Wanlass | 438/218 |

FOREIGN PATENT DOCUMENTS

| | | | |
|---|---|---|---|
| 3-191520 | 8/1991 | Japan | H01L 21/285 |
| 4-074865 | 3/1992 | Japan | C23C 16/08 |
| 8-264530 | 10/1996 | Japan | H01L 21/3205 |
| 2 245 600 | 1/1992 | United Kingdom | C23C 16/16 |

OTHER PUBLICATIONS

Oku, T., et al. "Thermal Stability of $WN_x$ and $TaN_x$ Diffusion Barriers Between Si and Cu", VMIC Conference, Jun. 27–29, 1995, pp. 182–185.

Akasaka, Y. et al., "Low–Resistivity Poly–Metal Gate Electrode Durable for High–Temperature Processing", VMIC Conf. Jun. 27–29, 1995, pp. 168–179.

Park, B.L., et al., "A Novel Deep–Submicron Contact Technology Using the PECVD–Grown $WN_x$ Barrier Layer", VMIC Conferenvce Jun. 27–29, 1995, pp. 186–192.

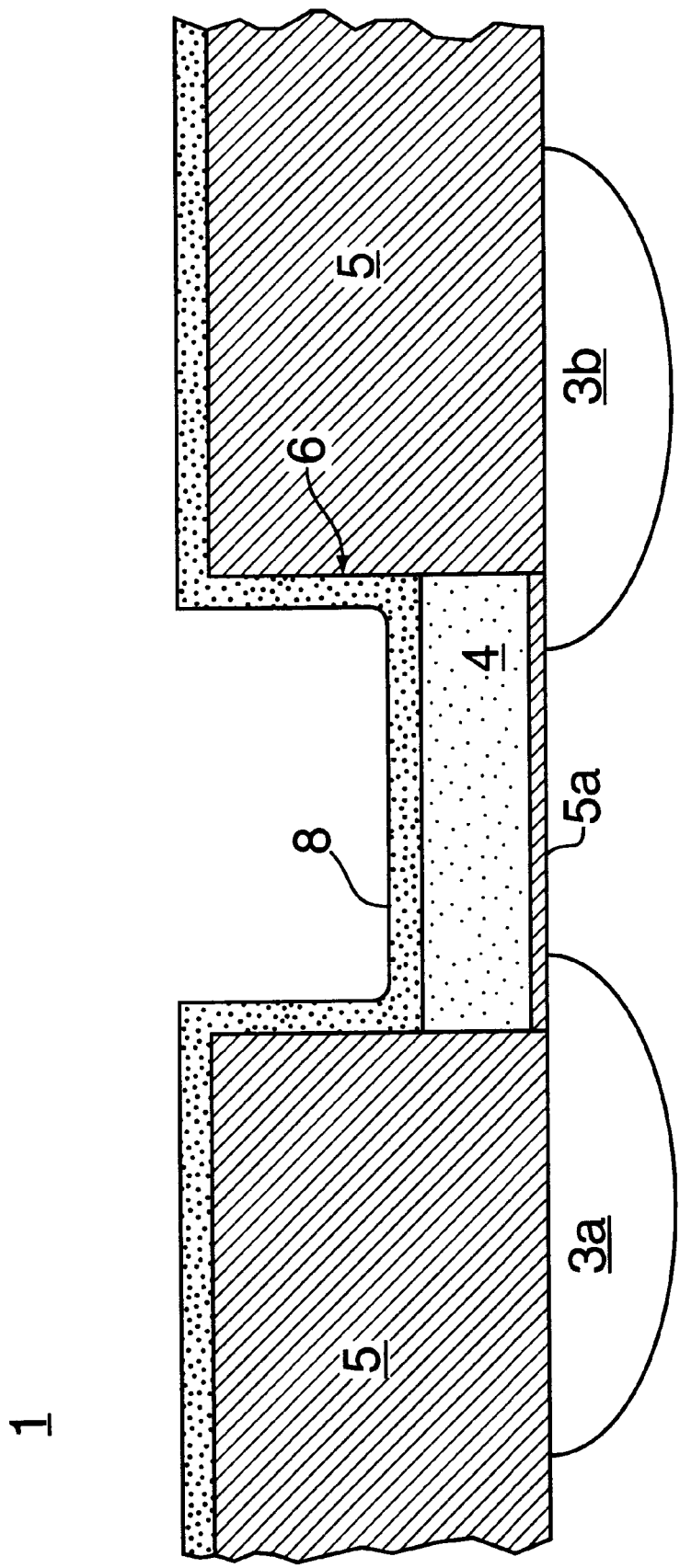

METHOD OF FORMING GATE ELECTRODE CONNECTION STRUCTURE BY IN SITU CHEMICAL VAPOR DEPOSITION OF TUNGSTEN AND TUNGSTEN NITRIDE

CROSS-REFERENCE TO RELATED APPLICATION

This application is a continuation-in-part of U.S. patent application Ser. No. 08/884,811 filed Jun. 30, 1997 which is incorporated herein by reference.

BACKGROUND OF THE INVENTION

1. Field of the Invention

The present invention relates to the fabrication of integrated circuits (IC's). More particularly, the invention provides a technique, including a method and apparatus, for forming a gate stack structure having an improved gate electrode connection structure formed by chemical vapor deposition (CVD) of tungsten (W) and plasma enhanced chemical vapor deposition (PECVD) of tungsten nitride ($W_x$) films.

2. Description of the Background Art

Modern integrated IC's contain large numbers of transistors. These transistors are generally field effect transistors that contain a source region and a drain region with a gate electrode located in between the source and drain regions.

A typical gate structure contains a thin polysilicon electrode that lies on top of a thin layer of gate oxide such as silicon dioxide ($SiO_2$). The gate electrode and gate oxide are formed between semiconducting source and drain regions, that define an underlying well of p-type or n-type silicon. The source and drain regions are doped opposite to the well to define the gate location, a layer of insulating material such as silicon oxide ($SiO_x$) or silicon nitride ($SiN_x$) is deposited on top of the source and drain regions and an aperture or via is formed in the insulating material between the source and drain regions. The gate structure within the via contains a thin oxide layer, a polysilicon layer and a metal plug. The metal plug is formed by vapor depositing a metal such as tungsten on top of the polysilicon gate electrode. To complete the connection, the silicon then is caused to diffuse into the tungsten during a thermal annealing process forming a layer of relatively uniform tungsten silicide ($WSi_x$) as the connection to the gate electrode. Without annealing, the silicon will ultimately diffuse into the tungsten forming a non-uniform layer of tungsten silicide.

A gate electrode having an electrical connection made of pure tungsten would be more desirable than a tungsten silicide electrode since tungsten has a lower resistivity than tungsten silicide. Unfortunately, silicon diffuses into the tungsten forming tungsten silicide. The diffusion can be prevented by depositing a layer of tungsten nitride ($W_xN$) as a diffusion barrier. $W_xN$ is a good conductor as well as an excellent diffusion barrier material. Such a barrier layer is formed by reducing tungsten hexafluoride ($WF_6$) with ammonia ($NH_3$) in a chemical vapor deposition (CVD) process.

Unfortunately, the above described process results in the formation of contaminant particles in the form of solid byproducts. These byproducts include ammonia adducts of tungsten hexafluoride (($NH_3)_4WF_6$), ammonium fluoride ($NH_4F$) and other ammonium complexes. Many of these particles become attached to the deposition chamber's interior. During temperature fluctuations within the chamber, the deposits flake off the walls and contaminate the wafer. Further, the tungsten nitride that is deposited using the above described process has a polycrystalline structure in which there are many grain boundaries. As a result, the diffusion barrier properties of the tungsten nitride are compromised. In addition, tungsten nitride films deposited by the traditional method tend not to adhere very well to the substrate upon which they are deposited.

Therefore, a need exists for a gate structure having a low resistivity tungsten gate electrode connection with a compatible diffusion barrier to prevent diffusion of silicon into the tungsten and a concomitant method and apparatus for manufacturing same.

SUMMARY OF THE INVENTION

The disadvantages associated with the prior art are overcome by the present invention of a gate electrode connection structure having a diffusion barrier of tungsten nitride ($W_xN$) deposited on top of a polysilicon gate electrode by a CVD process using two gaseous mixtures which do not have a gas phase reaction with each other until energy is applied to the gaseous mixtures. The gate connection structure further comprises a conductive layer of tungsten deposited using a plasma enhanced chemical vapor deposition (PECVD) process. According to a first embodiment of the invention, tungsten may be deposited on top of the tungsten nitride diffusion barrier using a PECVD method to form the gate electrode.

According to a second embodiment of the present invention, the tungsten is deposited using a multi-step CVD process in which diborane ($B_2H_6$) is added during a tungsten nucleation step.

The $W_xN$ deposition process of the present invention is performed by providing a gaseous mixture in a chamber that contains a wafer, and energizing the gaseous mixture to form a plasma. The gaseous mixture includes a first gaseous composition containing nitrogen and hydrogen and a second gaseous composition containing tungsten. The first gaseous composition is one that does not have a gas phase reaction with the second gaseous composition to form tungsten nitride, unless energy is provided to the gaseous mixture. The tungsten containing composition may be tungsten hexafluoride ($WF_6$). The first gaseous composition may include a mixture of $N_2$ and $H_2$. Additionally, the gaseous mixture may include an argon dilutant.

The gaseous mixture may be energized to form a plasma within a deposition zone. In the plasma, the $N_2$ nitrogen dissociates into nitrogen ions, and the tungsten separates from the fluorine. The nitrogen ions and tungsten then combine to form tungsten nitride ($W_2N$). The tungsten nitride reacts with a heated wafer surface in the chamber, so that a layer (or film) of tungsten nitride grows on the wafer's upper surface.

The hydrogen and fluorine combine to form hydrogen fluoride (HF) as a gaseous reaction byproduct that is discarded, i.e., removed from the chamber. Fewer contaminant particles are generated by depositing tungsten nitride in accordance with the present invention. This reduction in contaminant particles is achieved by eliminating the ammonia reaction in the gas phase that forms ammonium containing contaminants.

To improve the adhesion of the tungsten nitride film to the substrate, and especially to a wafer having an insulating layer upon which the tungsten nitride is deposited, the wafer is pretreated with a plasma before depositing the tungsten nitride film. The pretreatment can be accomplished in the same chamber as the tungsten nitride deposition by providing only the first gaseous composition and energizing it to form a plasma. As such, the wafer is pre-treated with a plasma of, for example, hydrogen or a gaseous mixture containing hydrogen and, for example, nitrogen. Once the wafer is treated, the tungsten hexafluoride can be added to the existing plasma to begin tungsten nitride deposition.

Tungsten nitride that is deposited in accordance with the present invention is more amorphous than traditionally deposited tungsten nitride and therefore, acts as a better diffusion barrier.

Once the tungsten nitride is deposited, a bulk layer of tungsten is deposited as a metallization layer to complete the gate structure. The bulk tungsten deposition is accomplished using CVD deposition of tungsten by thermal reduction of tungsten hexafluoride.

The tungsten deposition process according to a second embodiment of the present invention comprises a nucleation step followed by a bulk deposition step. In the nucleation step, a process gas including a tungsten-containing source, a group III or V hydride, and a reduction agent is flowed into a deposition zone of a substrate processing chamber while the deposition zone is maintained at or below a first pressure level. During the nucleation step, other process variables are maintained at conditions suitable to deposit a first layer of the tungsten film over the substrate. Next, during the bulk deposition step, the flow of the group III or V hydride into the deposition zone is stopped, and afterwards, the pressure in the deposition zone is increased to a second pressure above the first pressure level and other process parameters are maintained at conditions suitable for depositing a second layer of the tungsten film on the substrate.

In an alternate embodiment of the invention, the flow of the tungsten-containing source is stopped along with the flow of the group III or V hydride during the tungsten deposition stage. The flow of the tungsten-containing source is restarted when the pressure in the deposition zone is increased to the second pressure level. Preferably, the flow of the tungsten-containing source is stopped for a period of between 5 and 30 seconds.

BRIEF DESCRIPTION OF THE DRAWINGS

The teachings of the present invention can be readily understood by considering the following detailed description in conjunction with the accompanying drawings, in which:

FIG. 1C is a vertical cross sectional schematic of a partially formed gate structure according the present following tungsten nitride deposition;

To facilitate understanding, identical reference numerals have been used, where possible, to designate identical elements that are common to the figures.

DETAILED DESCRIPTION

I. Introduction

The present invention is a novel gate electrode connection structure containing tungsten deposited on top of a tungsten nitride diffusion barrier. The diffusion barrier and gate electrode are deposited using methods which reduce the resistivity of the resulting gate electrode, enhance the adhesion of the electrode to the underlying substrate, and reduce the effect of contaminants on gate electrode performance.

The method of forming the gate electrode connection structure of the present invention is shown FIGS. 1A–1E.

Figure 1A:
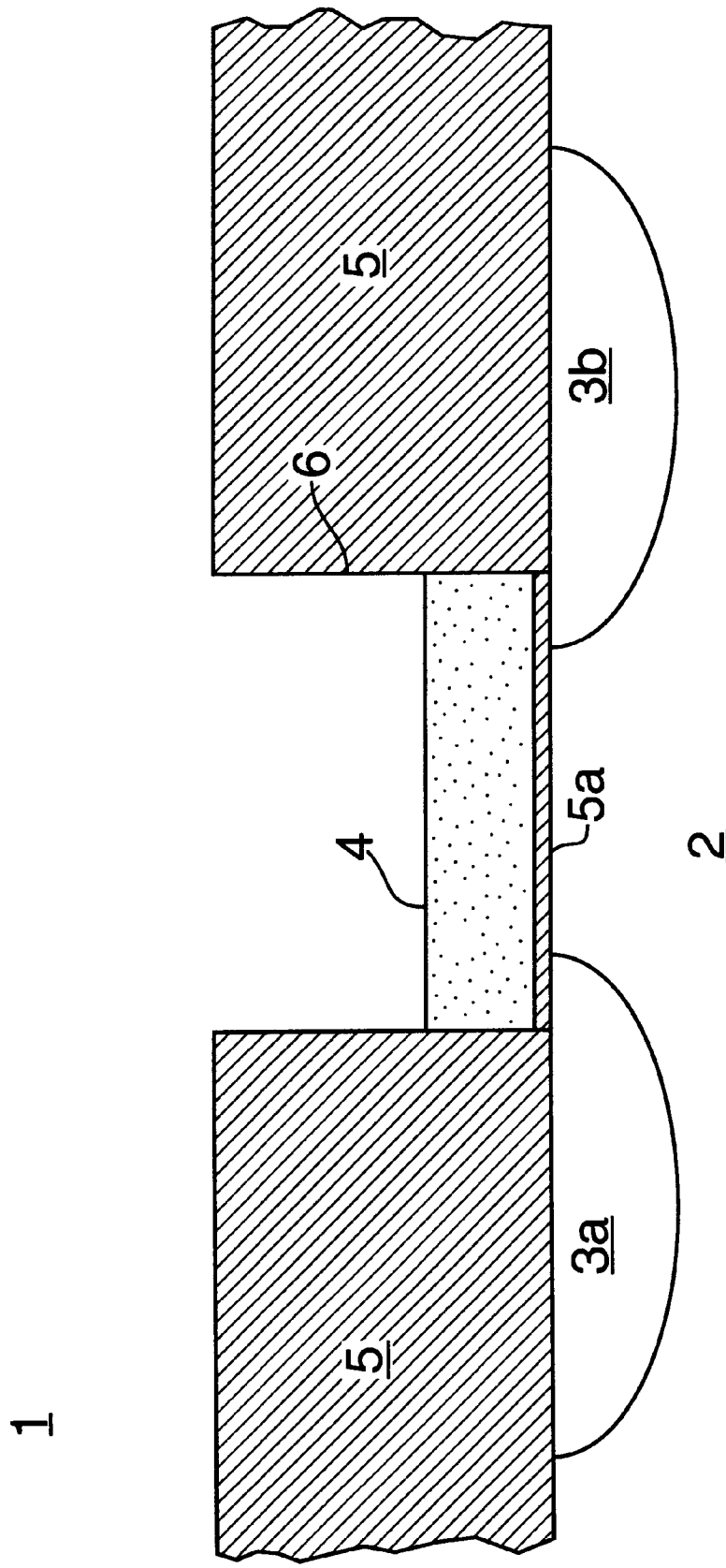
FIG. 1A is a vertical cross sectional schematic of a partially formed gate structure according the present invention.

FIG. 1A depicts a cross sectional schematic of a partially formed integrated circuit element 1 onto which a gate connection is to be formed. The gate structure is formed on a substrate containing of a well 2 of semiconducting material such as n-type or p-type silicon. The well 2 may be part of a substrate such as a semiconductor wafer and is defined by a source region 3a and a drain region 3b located on either side of the well 2 by ion bombardment with suitable dopant ions. For example, the well 2 may be doped with acceptor impurities such as gallium or indium, thereby forming a p-well. The source region 3a and drain region 3b may be doped with donor impurities such as phosphorous, antimony or arsenic, thereby forming n-type regions. Of course, the doping of the well 2, source region 3a and the drain region 3b may be reversed. A layer of an insulator 5 such as $SiO_2$ is deposited on top of the substrate using a dielectric deposition technique well known in the art. The insulating layer 5 overlies the source region 3a and the drain region 3b. An aperture 6 is formed in the insulating layer 5 by preferential etching. A thin layer of insulating material, such as silicon dioxide ($SiO_2$), forms a gate oxide 5a at the bottom of the aperture 6. The aperture 6 lies in between the source region 3a and the drain region 3b. A polysilicon gate electrode 4 lies on top of the gate oxide 5a.

Figure 1B:
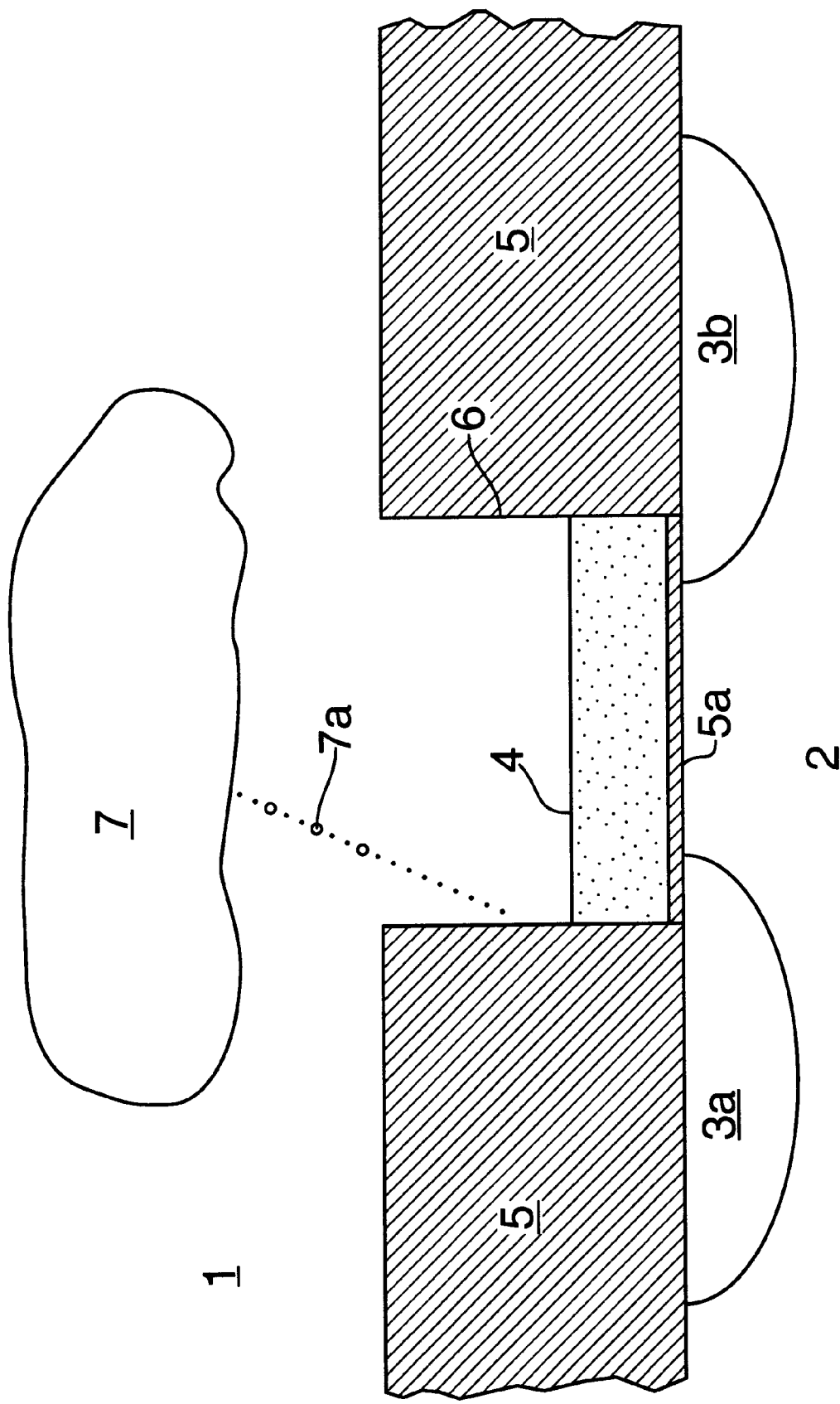
FIG. 1B is a vertical cross sectional schematic of a partially formed gate structure according the present undergoing tungsten nitride deposition in a plasma.

After the aperture 6 has been formed, the insulator 5 and exposed portions of the partially formed integrated circuit element 1 can be pretreated to improve the adhesion of a barrier layer. FIG. 1B depicts pretreatment of the partially formed integrated circuit element 1 by bombardment with ions 7a from a plasma 7. The plasma 7 is formed by energizing a gaseous mixture containing hydrogen and nitrogen. To deposit a tungsten nitride barrier layer, a tungsten containing gas such as tungsten hexafluoride is added to the plasma. In the plasma, $WF_6$ breaks down into tungsten and fluorine. The plasma dissociates and ionizes the $N_2$, forming nitrogen ions. The nitrogen ions and tungsten combine to form tungsten nitride ($W_2N$). The tungsten nitride falls to cover the upper surfaces of the exposed portion of the substrate 2 and the insulating layer 5 forming a diffusion barrier 8 as depicted in FIG. 1C.

Figure 1D:
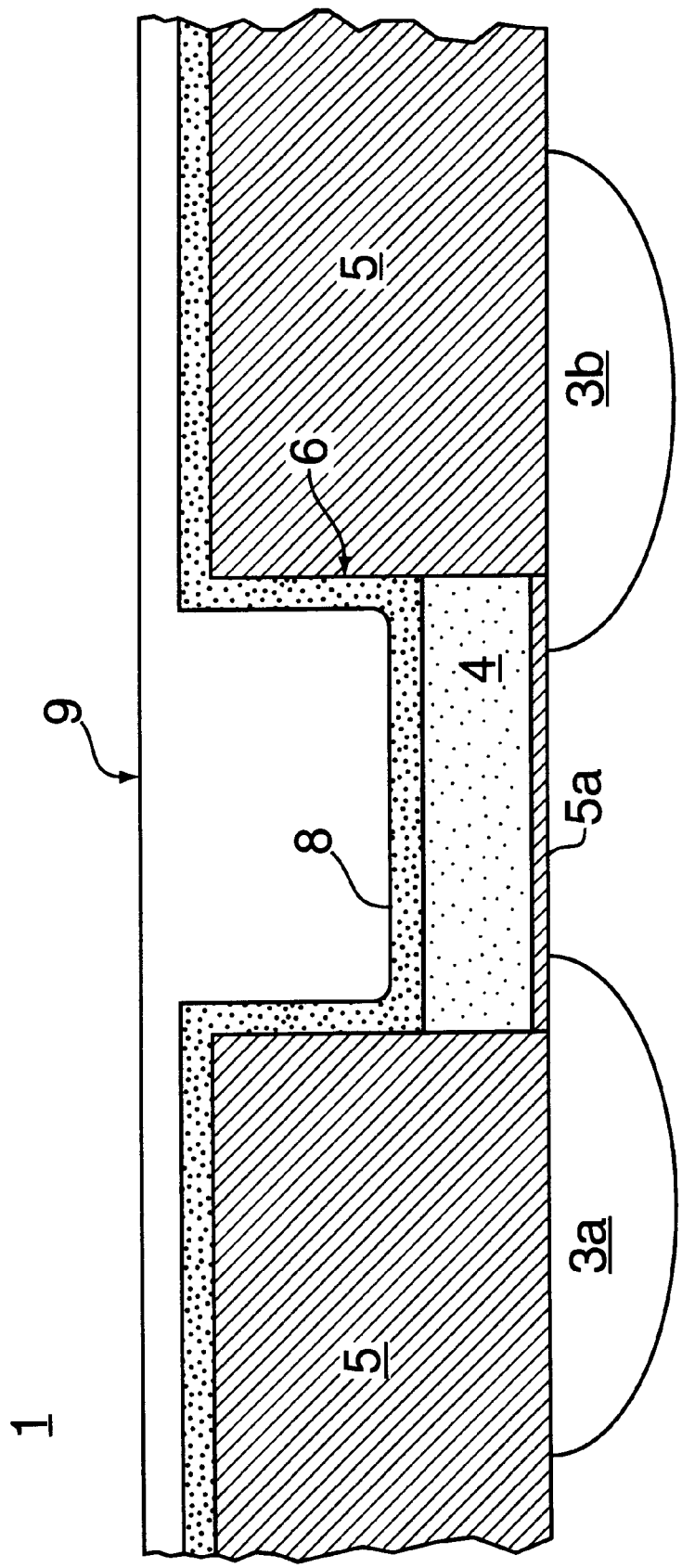
FIG. 1D is a vertical cross sectional schematic of a partially formed gate structure according the present following tungsten deposition.

In a first embodiment of the present invention, tungsten is deposited by a conventional CVD process using a gaseous mixture containing $WF_6$. During this process, the wafer containing the gate structure 1 is heated. The exposure of the $WF_6$ to the heated wafer surface causes a heat-induced chemical reaction to take place. As a result, the tungsten layer 9 is formed over the upper surface of the tungsten nitride diffusion barrier 8 as depicted in FIG. 1D.

In a second embodiment of the present invention, the tungsten layer 9 is deposited by flowing a tungsten containing gas such as $WF_6$ and a hydride of an element of group III or V, such as diborane $B_2H_6$, into the deposition chamber during a nucleation step. The wafer is heated causing a chemical reaction on the wafer during which tungsten layer 9 is deposited. The $B_2H_6$ reacts with the $WF_6$ on the hot wafer forming volatile $BF_3$, thereby removing fluorine from the reaction. As a result there is less fluorine in the tungsten layer 9 resulting in the growth of larger grains of tungsten and, therefore, better nucleation. The reduced fluorine and better nucleation in the subsequently deposited tungsten layer 9. The flow of the hydride is stopped before the bulk deposition of the tungsten layer 9. The tungsten films deposited in this manner have a combination of low resistivity and strong adhesion as compared to other tungsten films.

Figure 1E:
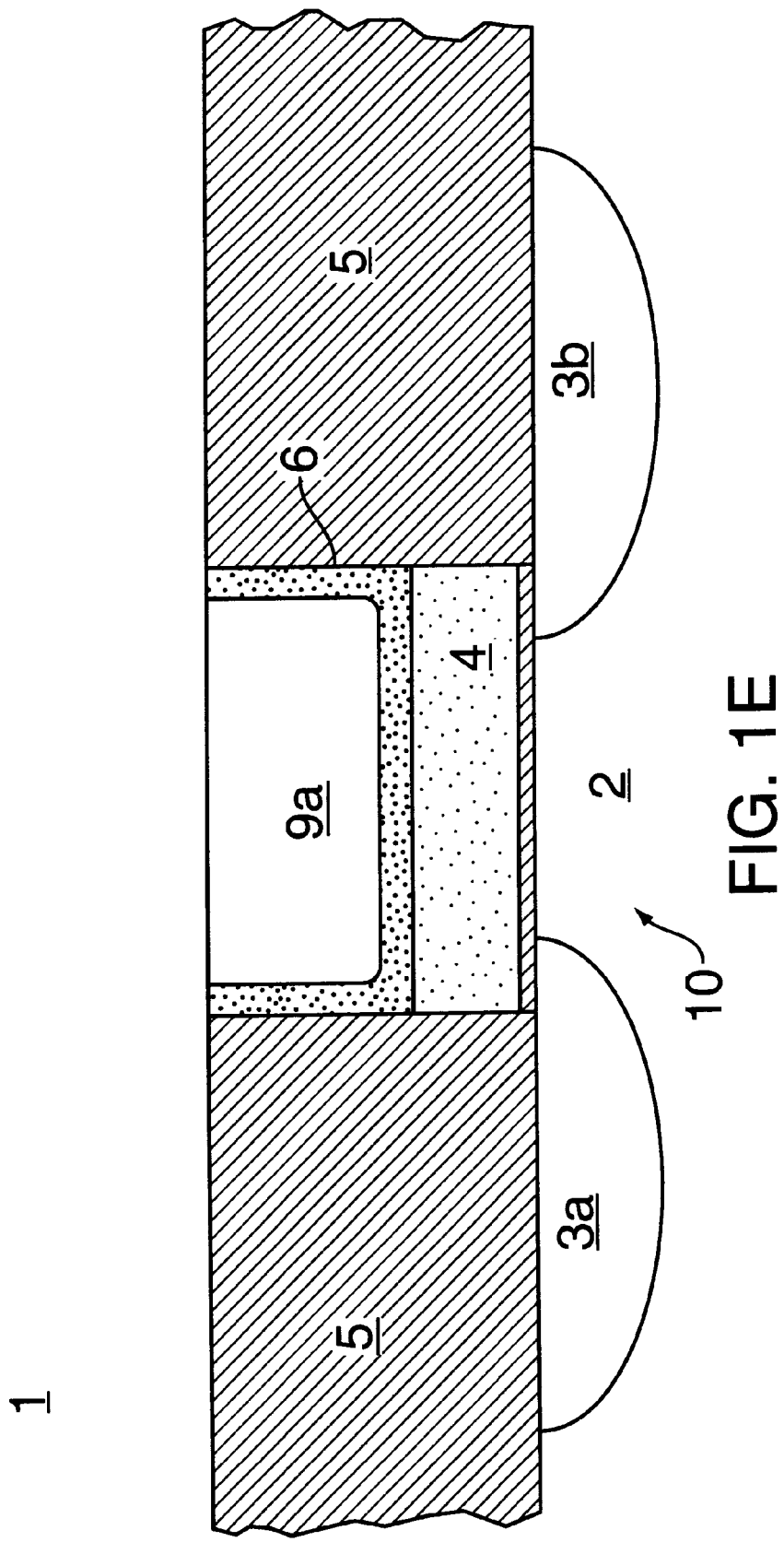
FIG. 1E is a vertical cross sectional schematic of a completed gate structure according the present invention after polishing.

As shown in FIG. 1E, the upper surface of the wafer may be polished to remove portions of the tungsten layer 9 and the $W_xN$ diffusion barrier 8 from the upper surface of the insulating layer 5. The resulting plug 9a constitutes the electrical connection to the gate electrode 4 of the completed integrated circuit element 10. The polishing may be achieved using a chemical mechanical polishing process that is well known in the art.

The tungsten and tungsten nitride films deposited by the method of the present invention are suitable for the fabrication of gate structures having feature sizes of 0.35 microns or less. Both the tungsten layer 9 and the $W_xN$ diffusion barrier 8 of the gate stack of the present invention can be deposited in situ within a single CVD chamber.

II. Exemplary CVD Reactor Chamber

In accordance with the present invention, the deposition of the tungsten layer 9 and $W_xN$ diffusion barrier 8 may be performed in any chamber that provides for plasma enhanced chemical vapor deposition. Since the tungsten nitride deposition is to be immediately followed by tungsten deposition, it is beneficial for the tungsten nitride deposition chamber to also be capable of depositing the metal. As a result, the plasma treatment and the two depositions may be performed in-situ, and thereby eliminate the need to expose the tungsten nitride to environmental contaminants that can be encountered when transferring wafers between chambers. For example, during a wafer transfer, the tungsten nitride may be exposed to oxygen, thereby causing a native oxide to form which increases the resistivity of the tungsten nitride to unacceptable levels and renders some of the wafer's dice defective.

The CVD chamber manufactured by Applied Materials, Inc. of Santa Clara, Calif. under the trade name WxZ Chamber and described in U.S. patent application Ser. No. 08/680,724, entitled Components Peripheral to the Pedestal in the Gas Flow Path within a Chemical Vapor Deposition Chamber, by Zhao, et al., filed on Jul. 12, 1996, and incorporated herein by reference, may be employed to deposit tungsten nitride in accordance with the present invention.

Figure 2:
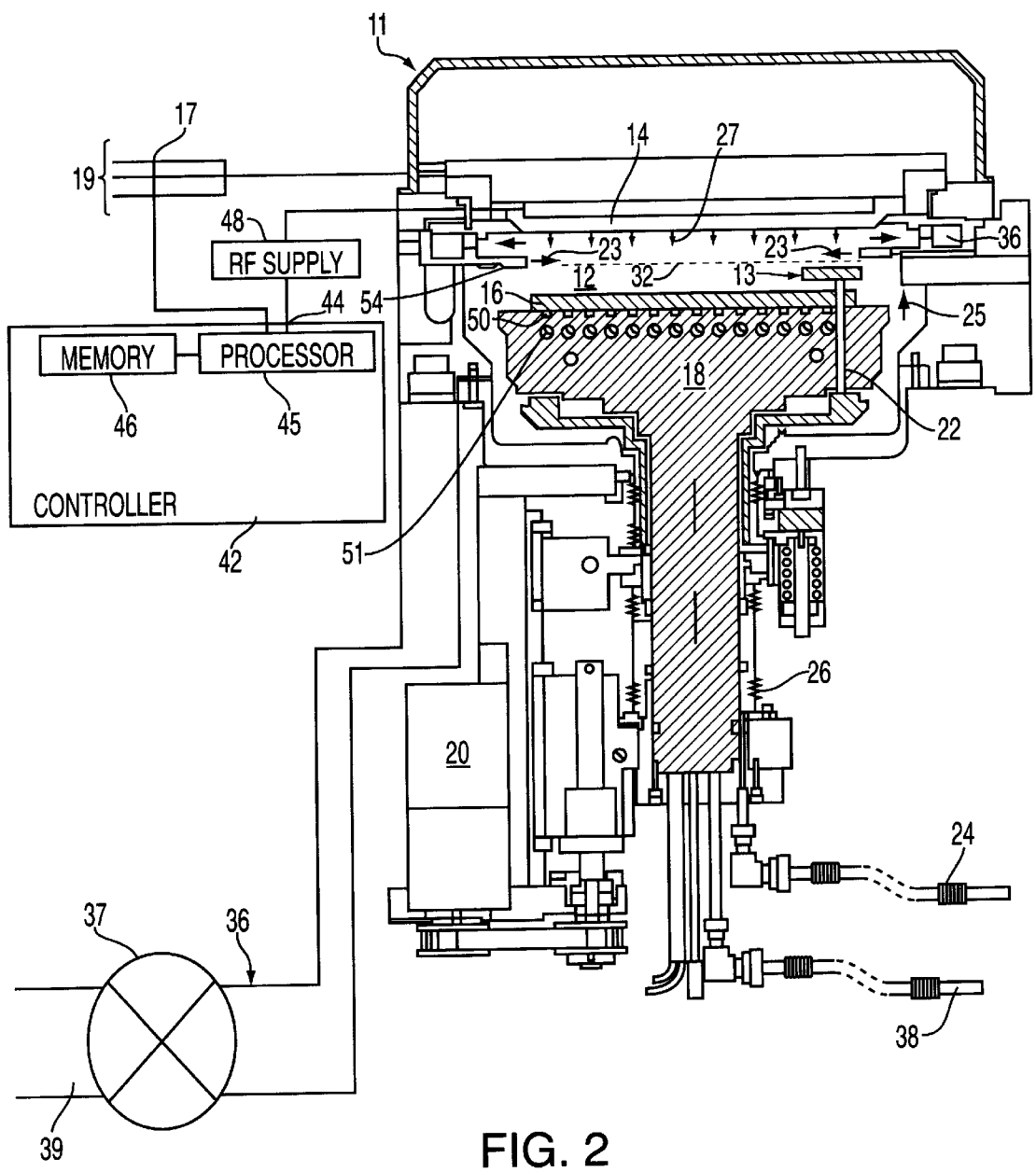
FIG. 2 is a vertical, cross-sectional view of one embodiment of a simplified chemical vapor deposition apparatus according to the present invention.

FIG. 2 illustrates one embodiment of a parallel plate, cold-wall chemical vapor deposition system 11 having a vacuum chamber 12 in which the tungsten layer 9 and tungsten $W_xN$ diffusion barrier 8 of the gate structure according to the present invention can be deposited. The CVD system 11 contains a gas distribution manifold 14 for dispersing deposition gases into the chamber 12 proximate a substrate such as a wafer 16 that rests on a resistively-heated susceptor 18.

The chamber 12 may be part of a vacuum processing system having multiple processing chambers connected to a central transfer chamber and serviced by a robot. The wafer 16 is brought into the chamber 12 by a robot blade through a slit valve in a sidewall of the chamber (not shown). The susceptor 18 is moveable vertically by means of a motor 20. The wafer 16 is brought into the chamber when the susceptor 18 is in a first position 13 opposite the slit valve. At position 13, the wafer 16 is supported initially by a set of pins 22 that pass through and are coupled to the susceptor 18. The pins 22 are driven by a single motor assembly.

As the susceptor 18 is brought to a processing position 32 opposite the gas distribution manifold 14 as shown by the dotted line, the pins 22 retract into the susceptor 18 and the wafer 16 is supported by the susceptor 18. Once positioned on the susceptor 18, the wafer 16 is affixed to the susceptor by a vacuum clamping system (vacuum grooves 50) or some other wafer retention system such as an electrostatic chuck.

As the susceptor 18 moves upward toward the processing position 32, the wafer 16 contacts a purge guide 54, which centers the wafer 16 on the susceptor 18. Edge purge gases 23 are flowed through the purge guide 54 across the edge of wafer 16 to prevent deposition gases from contacting the edge and backside of the substrate. Purge gases 25 are also flowed around the heater/susceptor 18 to minimize deposition on an around the heater/susceptor. These purge gases are supplied from a purge line 24 and are also employed to protect a stainless steel bellows 26 from damage by corrosive gases introduced into the chamber during processing.

Deposition and carrier gases are supplied to a deposition zone of the chamber through gas lines 19 to the manifold 14 in response to control of valves 17. During processing, gas supplied to the manifold 14 is distributed uniformly across the surface of the substrate as shown by arrows 27. Spent processing gases and by-product gases are exhausted from the chamber by means of an exhaust system 36. The rate at which gases are released through the exhaust system 36 into an exhaust line 39 is controlled by a throttle valve 37. During deposition, a second purge gas is fed against the edge of the wafer 16 through gas channels in the susceptor (not shown) and feed line 38 as previously described. An RF power supply 48 can be coupled to manifold 14 to provide for plasma-enhanced CVD (PECVD) and plasma cleaning of the chamber.

The wafer 16 is heated by means such as a resistive heater element 51 embedded within the body of the susceptor 18. Alternatively, a radiant heater or the like may be mounted external to the chamber 12 for heating the wafer 16.

The throttle valve 37, the gas supply valves 17, the motor 20, the resistive heater coupled to susceptor 18, the RF power supply 48 and other aspects of the CVD system 11 are controlled by a system controller 42 over control lines 44 (only some of which are shown). The system controller 42 includes a processor 45 and a memory 46. The system controller 42 operates under the control of a computer program stored in a computer-readable medium such as the memory 46. The computer program dictates the temperature, chamber pressure, timing, mixture of gases, RF power levels, susceptor position, heater current and other parameters of a particular process.

The processor 45 contains a single-board computer (SBC), analog and digital input/output boards, interface boards and stepper motor controller boards. Various parts of the CVD system 10 conform to the Versa Modular European (VME) standard which defines board, card cage, and connector dimensions and types. The VME standard also defines the bus structure as having a 16-bit data bus and a 24-bit address bus.

Preferably, the memory 46 is a hard disk drive, but may also include other kinds of memory. Other computer programs stored on other memory devices including, for example, a floppy disk or other appropriate drive, may also be used to operate the system controller 42.

The interface between a user and the system controller 42 is via a CRT monitor and a light pen (not shown). Other devices, such as a keyboard, mouse, or other pointing or communication device, may be used instead of or in addition to a light pen to allow the user to communicate with the system controller 42.

The process for depositing the film can be implemented using a computer program product that is executed by the system controller 42. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled WindowsJ library routines. To execute the linked, compiled object code the system user invokes the object code, causing the computer system to load the code in memory. The CPU then reads and executes the code to perform the tasks identified in the program.

Figure 3:
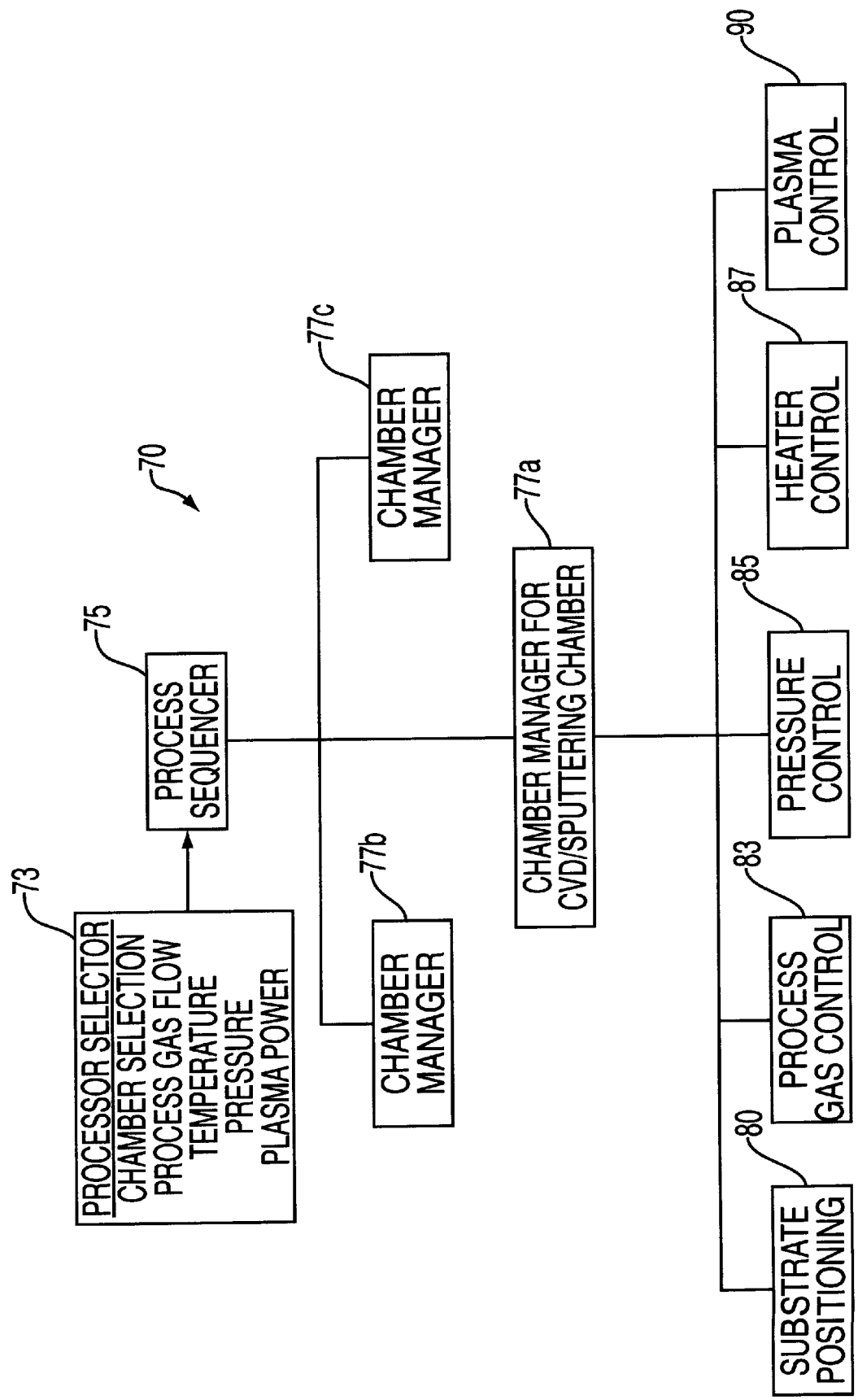
FIG. 3 shows an illustrative block diagram of the hierarchical control structure of the system control software, computer program 170, according to a specific embodiment.

FIG. 3 is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing, for example, a light pen/CRT monitor interface.

The signals for monitoring the process are provided by the analog and digital input boards of the system controller, and the signals for controlling the process are output on the analog and digital output boards of the CVD system 11.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77*a*–*c*, which controls multiple processing tasks in the process chamber 12 according to the process set determined by the sequencer subroutine 75. For example, the chamber manager subroutine 77*a* comprises program code for controlling sputtering and CVD process operations in the process chamber 12. The chamber manager subroutine 77 also controls execution of various chamber component subroutines that control operation of the chamber components necessary to carry out the selected process set. Examples of chamber component subroutines are a substrate positioning subroutine 80, a process gas control subroutine 83, a pressure control subroutine 85, a heater control subroutine 87 and a plasma control subroutine 90 in some embodiments. A person having ordinary skill in the art will readily recognize that other chamber control subroutines can be included depending on what processes are to be performed in the process chamber 12. In operation, the chamber manager subroutine 77*a* selectively schedules or calls the process component subroutines in accordance with the particular process set being executed. The chamber manager subroutine 77*a* schedules the process component subroutines much like the sequencer subroutine 75 schedules which process chamber 12 and process set are to be executed next. Typically, the chamber manager subroutine 77*a* includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 2 and FIG. 3. The substrate positioning subroutine 80 comprises program code for controlling chamber components that are used to load the wafer 16 onto the susceptor 18 and, optionally, to lift the wafer 16 to a desired height in the chamber 12 to control the spacing between the wafer 16 and the gas distribution manifold 14. When a substrate such as the wafer 16 is loaded into the process chamber 12, the susceptor 18 is lowered to receive the wafer 16. Thereafter, the susceptor 18 is raised to the desired height in the chamber 12, to maintain the wafer 16 at a first distance or spacing from the gas distribution manifold during the CVD process. In operation, the substrate positioning subroutine 80 controls movement of the susceptor 18 in response to process set parameters related to the support height that are transferred from the chamber manager subroutine 77*a*.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 12 to stabilize the pressure in the chamber before reactive process gases are introduced. For these processes, the process gas control subroutine 83 is programmed to include steps for flowing the inert gas into the chamber 12 for an amount of time necessary to stabilize the pressure in the chamber, and then the steps described above would be carried out.

The pressure control subroutine 85 comprises program code for controlling the pressure in the chamber 12 by regulating the size of the opening of the throttle valve 37 in the exhaust system of the chamber. The size of the opening of the throttle valve 37 is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 12 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve 37 according to the PID values obtained from the pressure table. Alternatively, the pressure control subroutine 85 can be written to open or close the throttle valve 37 to a particular opening size to regulate the chamber 12 to the desired pressure.

The heater control subroutine 87 comprises program code for controlling the current to a heating element 51 that is used to heat the wafer 16. The heater control subroutine 87 is also invoked by the chamber manager subroutine 77a and receives a target, or set-point, temperature parameter. The heater control subroutine 87 measures the temperature by measuring voltage output of a thermocouple located in the susceptor 18, comparing the measured temperature to the set-point temperature, and increasing or decreasing current applied to the heating element 51 to obtain the set-point temperature. The temperature is obtained from the measured voltage by looking up the corresponding temperature in a stored conversion table, or by calculating the temperature using a fourth-order polynomial. When an embedded loop is used to heat the susceptor 18 the heater control subroutine 87 gradually controls a ramp up/down of current applied to the loop. Additionally, a built-in fail-safe mode can be included to detect process safety compliance, and can shut down operation of the heating element 51 if the process chamber 12 is not properly set up.

The chamber 12 is outfitted with an RF power supply 48 that is used for PECVD, chamber cleaning or other plasma processes. When a plasma process is employed, plasma control subroutine 90 comprises program code for setting the frequency RF power levels applied to the process electrodes in the chamber 12. Similar to the previously described chamber component subroutines, the plasma control subroutine 90 is invoked by the chamber manager subroutine 77a.

The above CVD system description is mainly for illustrative purposes and should not be considered as limiting the scope of the present invention. Variations of the above described system, such as variations of platen or susceptor design, heater design, location of RF power connections and others are possible. The method for depositing a tungsten layer according to the present invention is not limited to any specific processing apparatus.

Figure 4:
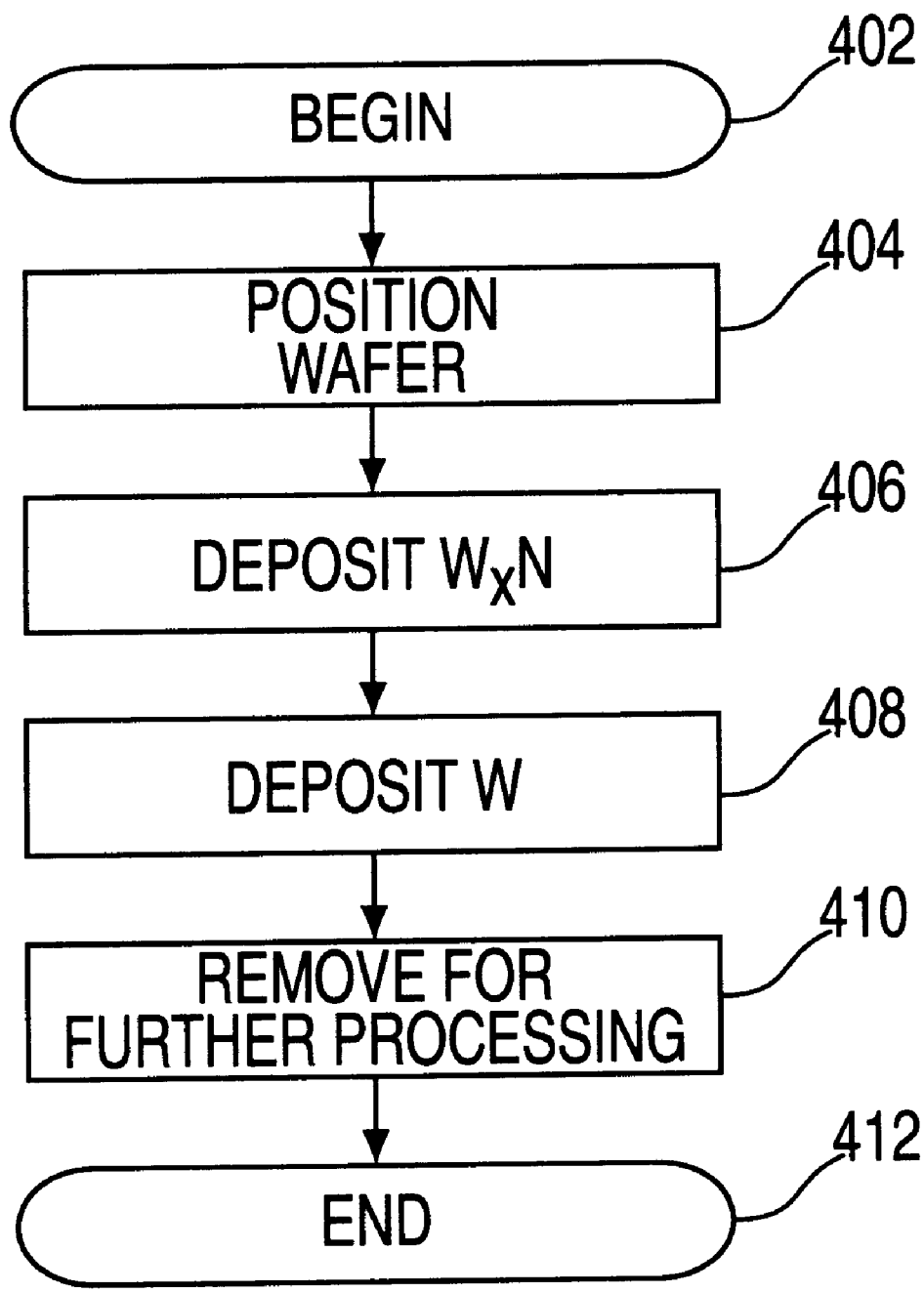
FIG. 4 depicts a flow diagram that illustrates the sequence of operations of the method of forming the gate structure of the present invention.

The steps executed by the program running on the system controller 42 are depicted as a flow diagram in FIG. 4. The program 400 begins at step 402. In step 404 the substrate positioning subroutine 80 controlling the necessary chamber elements to position the wafer 16 on the susceptor. Next, in step 406, the process gas control subroutine 83, pressure control subroutine, heater control subroutine 87 and plasma control subroutine 90 direct the relevant chamber elements to execute the steps of the tungsten nitride deposition stage of the method of the present invention. Next, in step 408, the process gas control subroutine 83, pressure control subroutine, and heater control subroutine 87 direct the relevant elements of the chamber 12 to execute the steps of the tungsten deposition stage of the method of the present invention. Finally, in step 410, the process sequencer 75 CVD chamber manager 77a and substrate positioning subroutine 80 to control the necessary elements of the chamber 12 to remove the wafer 16 from the susceptor 18 for further processing. The process then ends at step 412. Other process steps such as wafer cool-down or chamber cleaning may be optionally invoked as required within the sequence depicted in FIG. 4.

III. Tungsten Nitride Deposition

To pretreat the wafer prior to tungsten nitride deposition, as depicted in FIG. 1B, the first gaseous mixture of one or more gases containing at least hydrogen with or without nitrogen in the mixture is flowed into the chamber and energy is applied to form a pretreatment plasma. One embodiment of the invention uses a gaseous mixture of hydrogen and nitrogen to form the pretreatment plasma 7. After a short period of time, the second gas mixture is then added to the plasma 7 to begin tungsten nitride deposition onto the wafer. If nitrogen was not used in the first gaseous mixture, it must be added to the plasma 7 with the second gaseous mixture to facilitate tungsten nitride deposition.

The signal that is applied to form the plasma 7 may have a frequency in the range of 100 kilohertz ("KHz") to 5 gigahertz ("GHz"). The infusion of energy energizes the hydrogen in the first gaseous mixture such that the wafer is effectively "cleaned" prior to tungsten nitride deposition, and the infusion of energy to the combination of the first and second gaseous mixtures enhances the dissociation of $N_2$ nitrogen into nitrogen ions to facilitate tungsten nitride deposition. The energy also fuels the break down of the tungsten hexafluoride, so that the fluorine separates from the tungsten and combines with the hydrogen to form hydrogen fluoride (HF). The nitrogen ions and tungsten combine to form tungsten nitride ($W_2N$) which is subsequently deposited on the wafer to form the diffusion barrier 8.

The hydrogen fluoride (HF) byproduct that is formed in the deposition of the tungsten nitride is exhausted from the chamber 12. In contrast to the solid byproducts formed by the traditional deposition of tungsten nitride, the HF byproduct is gaseous. Accordingly, the number of contaminant particles that are left behind after the deposition of tungsten nitride in accordance with the present invention are greatly reduced over traditional tungsten nitride deposition processes. In general, the deposition of tungsten nitride in accordance with the present invention results in the generation of only 30 or less particles per eight inch wafer.

The nitrogen and hydrogen are each provided at a flow rate in the range of 1 standard cubic centimeter per minute ("sccm") to 5,000 sccm, and the flow rate of the argon dilutant is in a range of 1 sccm to 5,000 sccm. The nitrogen and hydrogen are supplied to the chamber 12 to form a treatment plasma 7 for 15 to 30 seconds before the tungsten hexafluoride is supplied to the chamber 12. The tungsten hexafluoride in the gaseous mixture is supplied at a flow rate in a range of 1 sccm to 100 sccm.

The energy from the signal first excites the hydrogen such that the hydrogen and nitrogen effectively treat (i.e., sputter clean) the insulator layer surface and then promotes the dissociation of nitrogen into nitrogen ions. The energy also promotes the reduction of the tungsten hexafluoride into tungsten, which combines with the nitrogen ions, and fluorine, which combines with the hydrogen. As a result, the tungsten and nitrogen combine to form tungsten nitride ($W_2N$), and the hydrogen and fluorine combine to form hydrogen fluoride (HF).

In accordance with the present invention, the signal that is provided by the RF supply 48 to form the plasma 7 has a frequency in the range of 100 KHz to 5 GHz. The power of the signal is in a range of 1 watt to 5 kilowatts. Preferably, the signal's power is in a range of 100 watts to 1 kilowatt. The treatment plasma 7 is maintained for a period of between 15 and 30 seconds and the deposition plasma is maintained for a period of time between 5 and 600 seconds. The repeated cycling of voltage from the RF supply 48 results in a surplus of electrons in the vicinity of the wafer 16 that produce a negative bias at the wafer 16. The gas distribution manifold 14 may acquire a negative bias between –200 to –450 volts, typically –400 volts. The processing chamber 12 and the susceptor 18 are grounded, and the negative bias of the wafer 16 is between –100 to –250 volts, typically –200 volts, which remains approximately constant during the time that the plasma 7 is maintained. The voltage gradient directs the tungsten nitride that is formed in the plasma onto the surface of the wafer 16.

Once the plasma generation is completed the hydrogen fluoride (HF) is exhausted from the processing chamber 12 by the exhaust system 36. As a result of tungsten nitride being deposited on an eight inch wafer, in accordance with the present invention, the number of contaminant particles that are generated is 30 or less.

Figure 5:
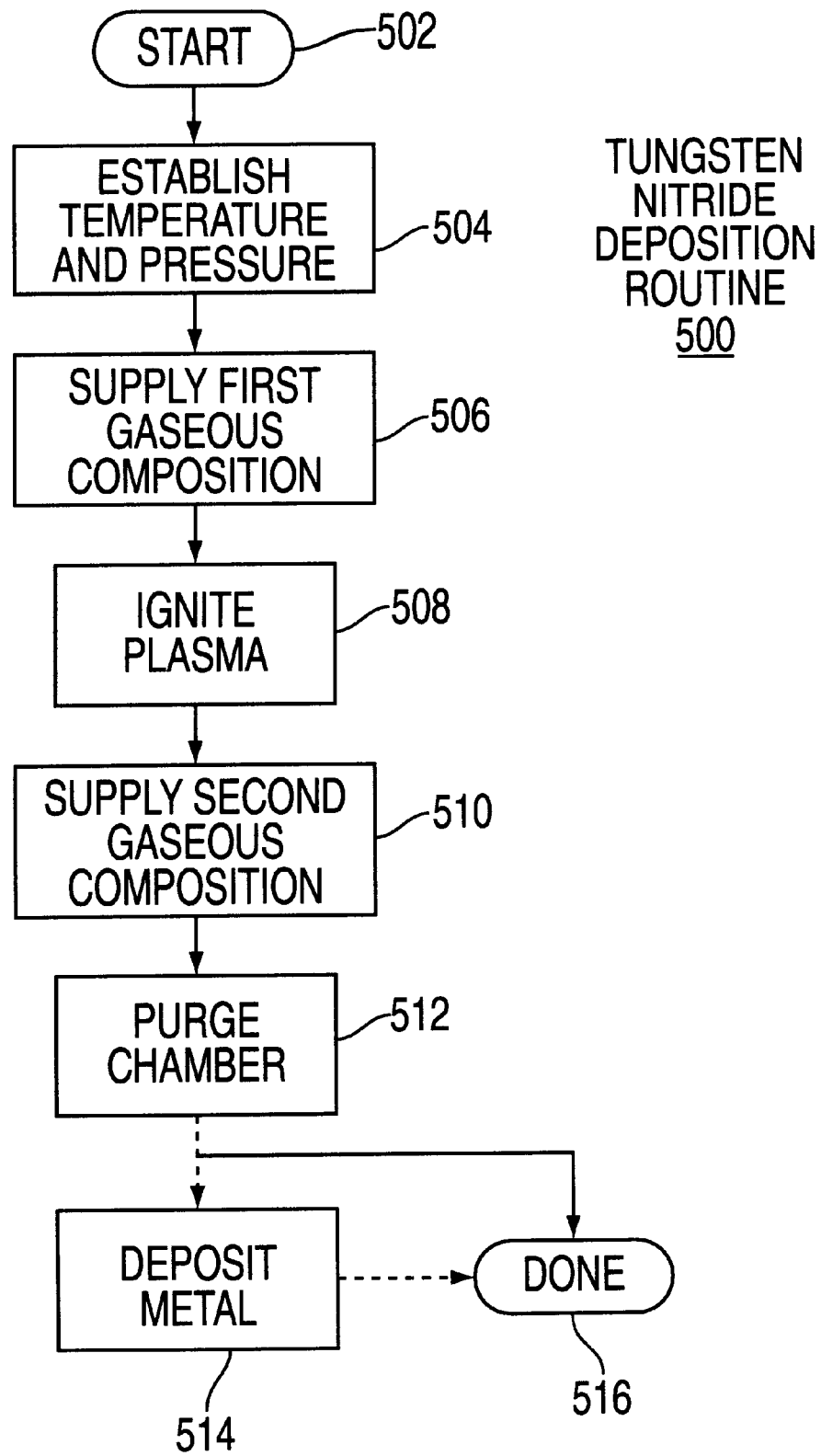
FIG. 5 depicts a flow diagram that illustrates the sequence of operations performed by the control software during the tungsten nitride deposition stage of the present invention.

FIG. 5 illustrates a sequence of process steps of the routine for the tungsten nitride deposition stage of the present invention. The routine 500 may be performed by the system controller 42 in response to program code instructions that it receives from the memory 46. Upon initiating (at step 502) the deposition of tungsten nitride, the processing chamber 12 temperature and pressure are established in step 504. In setting the pressure and temperature, the system controller 42 executes instructions received from the memory 46. The execution of these instructions results in elements of the chamber being operated to set the wafer temperature and the chamber pressure.

For example, the system controller 42, in response to the retrieved instructions from pressure control subroutine 85, causes the exhaust system 36 to set the processing chamber 12 pressure to be in a range of 0.1 Torr. to 100 Torr. The system controller 42 also instructs the heating element 51 to heat the wafer to a temperature in a range of 200° C. to 600° C. in response to heater control subroutine 87.

Once the processing chamber's temperature and pressure have been established, the system controller 42 executes instructions from the plasma control subroutine 90 which cause, at step 506, the control valves 17 to flow a first gaseous mixture into the chamber and, at step 508, the RF supply 48 to provide an RF signal having a desired frequency to supply energy to the first gaseous mixture for igniting a plasma. For example, the gas control valves 17 are controlled, at step 506 to provide a first gaseous mixture containing nitrogen and hydrogen, as described above to form a wafer treatment plasma.

Further, in step 508, the processor unit 42 instructs the RF supply 48 to provide a signal to the gas manifold 14 having a frequency in the range of 100 KHz to 5 GHz with a power in a range of 1 watt to 5 kilowatts. The processor unit 42 causes such a signal to be provided for a time in the range of 15 to 30 seconds. Thereafter, the processor unit 42 causes, at step 510, the gas control valves 17 to supply tungsten hexafluoride and argon to the gas manifold 14 through the gas lines 19. As such, tungsten nitride is deposited upon the wafer 16. The deposition process lasts for a time in the range of 5 to 600 seconds.

Once the generation and maintenance of the plasma is completed, the interior of the chamber is purged in step 512. The system controller 42 instructs the exhaust system 36 to remove all reaction byproducts from the processing chamber 12. Once the processing chamber 12 has been purged, the deposition of tungsten nitride is completed. Thereafter, the chamber can be used, at step 514, to deposit tungsten upon the tungsten nitride by conventional CVD as described above. Once the tungsten is deposited, the process is complete at step 516. The wafer 16 can then be removed and planarized (polished) to complete the gate structure.

IV. CVD Tungsten Deposition

In one embodiment of the invention, the tungsten layer 9 is deposited on the barrier layer (i.e., the tungsten nitride layer 8) on wafer 16 in processing chamber 12. The temperature of the wafer 16 is set to be in a range of 200° C. to 600° C., and the pressure in the processing chamber 12 is set to be in a range of 0.01 Torr. to 760 Torr. The gas control valves 17 provide a gaseous mixture of tungsten hexafluoride and hydrogen to the gas manifold 14. Nitrogen is optionally added to the gaseous mixture. The gaseous mixture may also include an argon dilutant. The gas manifold 14 flows the gaseous mixture into the processing chamber 12 where the wafer 16 resides. The flow rate of the tungsten hexafluoride may be in a range of 1 sccm to 100 sccm, while the flow rate of the nitrogen and hydrogen are in a range of 1 sccm to 5,000 sccm. The flow rate of argon may be in the range of 1 sccm to 5,000 sccm. Such a process for depositing tungsten is disclosed in commonly assigned U.S. Pat. No. 5,028,565 issued Jul. 2, 1991 and incorporated herein by reference.

At this point, the wafer 16 containing the gate structure 1 may be removed from the processing chamber 12 and transferred to a machine for removing undesired portions of the tungsten layer 9 and tungsten nitride diffusion barrier 8, i.e., a chemical mechanical polishing (CMP) machine.

V. CVD Tungsten Deposition with $B_2H_6$

As described above, hydrogen fluoride (HF) is produced as a byproduct of the reaction between tungsten hexafluoride and the second gaseous composition containing hydrogen and nitrogen. When practicing alternate embodiments of the present invention, a gaseous fluorine byproduct may also be produced from the reaction of tungsten hexafluoride, nitrogen, and hydrogen. The fluorine is produced in addition to the hydrogen fluoride, because there may not be enough hydrogen to bond with all of the fluorine from the tungsten hexafluoride.

In some instances, the excess fluorine diffuses into the partially formed integrated circuit on the wafer 16. This can increase the resistivity of the layers of material into which the fluorine diffuses. Further, when tungsten nitride is being deposited in accordance with the present invention to form a gate structure, the fluorine byproduct may diffuse through an underlying gate and increase the thickness of the gate oxide 5a. An overly thick gate oxide can render a field effect transistor inoperable.

Figure 6:
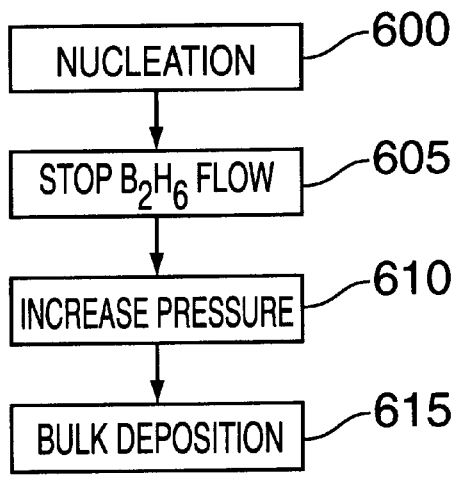
FIG. 6 depicts a flow diagram illustrating the steps of a first embodiment of the method of tungsten deposition using diborane of the present invention.

In further embodiments of the present invention, an additional gas may be added during deposition to the second gaseous composition containing hydrogen and nitrogen to provide for the absorption of the excess fluorine. The additional gas may either be used in conjunction with or as a substitute for the hydrogen in the second gaseous composition when used in the deposition plasma. In accordance with the present invention, the additional gas may be a hydride of Group III or V. In two further embodiments of the present invention, diborane $B_2H_6$ is employed in the tungsten deposition stage as the additional gas FIG. 6 illustrates the process of a first of these two further embodiments of the invention that is used to deposit a tungsten film using diborane. The process is for exemplary purposes and is not intended to limit the scope of the claims of the present invention. Where applicable, reference numbers in the description below are used to refer to appropriate components of the exemplary chamber of FIG. 2. This process is implemented and controlled using a computer program stored in the memory 46 of CVD system 10.

As shown in FIG. 6, the present invention includes a nucleation step 600 in which a process gas including a tungsten-containing source, a group III or V hydride, a silane gas, such as monosilane ($SiH_4$), and a carrier gas, such as argon (Ar) are flowed into chamber 12 for between about 10 to 60 seconds to grow a thin tungsten layer that acts as a growth site for subsequent tungsten film. In a preferred embodiment, the tungsten-containing source is $WF_6$ and the group III or V hydride is $B_2H_6$. Optionally, a reduction agent, such as $H_2$, and a nitrogen-containing source, such as $N_2$, may be added to the process gas. The current to the heater element 51 is set so that the wafer temperature is between about 350 and 475° C. (corresponding to a wafer temperature of about 325–450° C.) while chamber pressure is set to between 1 and 50 Torr.

After the completion of nucleation step 600, the flow of the tungsten-containing source and the flows of, the hydride and the silane gases are stopped (step 605), and the pressure of the chamber is increased in preparation for bulk deposition step 515 (step 610). In step 605, once the tungsten-containing source, hydride and silane gas flows are stopped, the carrier gas flow is maintained for between about 5 to 40 seconds to purge the chamber of residual gases. If $N_2$ and $H_2$ gas flows are included in the process gas in step 600, these flows may also be maintained during this purge step. Chamber pressure is increased in step 610 in order to increase the deposition rate of tungsten in bulk deposition step 615. Preferably, the pressure is increased to between about 50 and 760 Torr.

Finally, during bulk deposition step 615, the tungsten-containing source is reintroduced in the process gas and other process variables are maintained at conditions suitable to deposit a second layer of the tungsten film. If $H_2$ or a similar reduction agent was included in the process gas in steps 600–610, this flow should be continued in step 615. If $H_2$ or a similar reduction agent was not used in steps 600–610, such a flow is started in step 615. Maintaining or initiating a flow of a nitrogen-containing source is optional.

The length of bulk deposition step 615 depends on the thickness of the desired tungsten film. It is important to accurately control the amount of $B_2H_6$ introduced during nucleation step 600. Experiments have shown that resistance and resistivity initially decrease with the addition of $B_2H_6$ to the nucleation process gas, but then actually increase once the amount of $B_2H_6$ introduced reaches a saturation point. Preferably, the rate at which $B_2H_6$ is introduced into the chamber in this step is limited to between 1 and 50 scam (expressed as an undiluted flow).

Tungsten films deposited according to the above method have a larger grain size than both tungsten films deposited without $B_2H_6$ and tungsten films deposited with $B_2H_6$ added in different manner, e.g., when $B_2H_6$ is added during the bulk deposition period. It is believed that the increased grain size results in a lower resistivity because there are fewer grain boundaries and reduced grain boundary scattering. It is believed that the presence of $B_2H_6$ at the surface of the substrate before the bulk deposition step and its evacuation before the pressure within the chamber is increased allows for formation of the larger grain size and reduces the amount of boron incorporated in the film. It is further believed that when boron is present in the chamber as the pressure is increased during the transition period between the nucleation and bulk deposition steps, boron is trapped in the film interface thus causing adhesion problems. Introducing and evacuating $B_2H_6$ in the manner taught by the present invention (i.e., before the pressure increase) provides improved adhesion as compared to a CVD tungsten $B_2H_6$ process that does not use the steps of the present invention.

Figure 7:
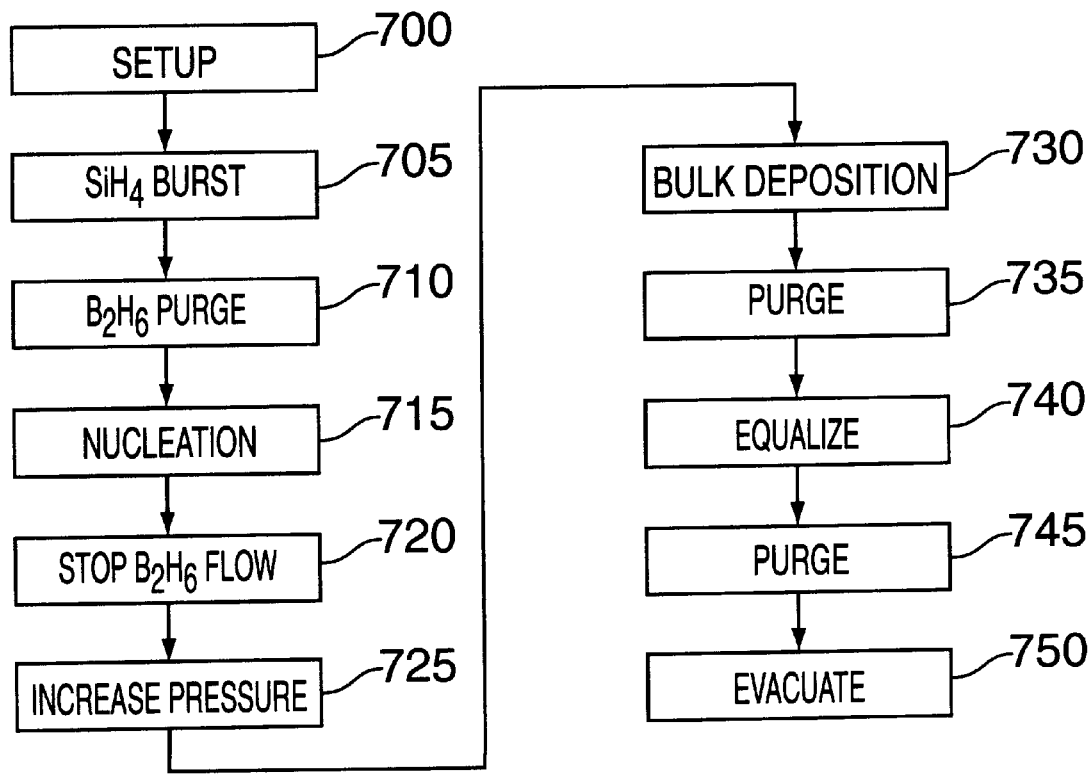
FIG. 7 depicts a flow diagram illustrating the steps of a second embodiment of the method of tungsten deposition using diborane of the present invention.

In a second of the two further embodiments of the method of the present invention shown in FIG. 7, various setup, purge and other steps are performed in addition to the nucleation, purge, pressurization and bulk deposition steps described with respect to FIG. 6. As shown in FIG. 7, several steps including a setup step 700, a silane burst step 705 and a $B_2H_6$ presoak/purge step 710 are performed before a nucleation step 715. In set-up step 700, the wafer is positioned 400 mil from the gas distribution manifold and heated to a temperature of 425° C. (about 8 seconds). Then Ar and $N_2$ are flowed into the chamber through manifold 14 at flow rates of 1000 sccm and 300 scam, respectively, for 6 seconds and chamber pressure is set to 30 Torr. A second flow of argon is flowed through the edge purge guide 54 at a rate of 1000 sccm. In step 705, $SiH_4$ and $H_2$ flows are added the Ar+$N_2$ process gas for 15 seconds at rates of 300 and 1000 sccm, respectively, in order to incorporate silicon onto the substrate prior to introducing $WF_6$. This helps prevent $WF_6$ from attacking the silicon substrate by either etching the substrate surface or forming a silicide reaction.

Next, in step 710 the wafer is chucked to vacuum chuck 18 and the $SiH_4$ flow is stopped. A flow of $B_2H_6$ is also added to the argon, $H_2$ and $N_2$ flow to purge residual $SiH_4$ from the chamber and present $B_2H_6$ at the surface of the wafer. During this period, the flow of the Ar edge purge gas is increased to 2800 sccm. This $B_2H_6$ purge step lasts for 20 seconds and introduces $B_2H_6$ at a rate of 250 sccm. $B_2H_6$ is introduced as a solution of $B_2H_6$ diluted with argon. The diborane gas is typically diluted in argon at a ratio of about 5% diborane:argon or less. Thus, the 250 sccm diluted $B_2H_6$ flow is equivalent to a 12.5 sccm undiluted $B_2H_6$ flow. After the wafer has been chucked and $SiH_4$ has been purged, a nucleation step 715 is initiated. Nucleation step 715 flows a process gas of $WF_6$, $B_2H_6$, $SiH_4$, $H_2$, $N_2$ and Ar into chamber 12 for 25 seconds to grow a thin tungsten layer as described above. In the second embodiment, the flow rates of $WF_6$, $B_2H_6$, $SiH_4$, $H_2$, $N_2$ and Ar during nucleation step 715 are 30, 50, 15, 1000, 300 and 1500 sccm, respectively. The 50 sccm diluted $B_2H_6$ flow is equivalent to a 2.5 sccm undiluted $B_2H_6$ flow. The chamber temperature is set to 425° C. while chamber pressure is set to 30 Torr.

After the completion of nucleation step 715, the flows of the $B_2H_6$, $WF_6$ and $SiH_4$ gases are stopped and the wafer is moved to a position 600 mil from manifold 14 (step 720) before the pressure of the chamber is increased to 90 Torr (step 725). Step 720 maintains the $N_2$, $H_2$ and Ar flows for 8 seconds after the $B_2H_6$, $WF_6$ and $SiH_4$ flows are stopped, to purge the chamber of residual gases. Also, during purge step 720, the Ar carrier gas flow is increased to 2700 sccm and the Ar edge purge flow is increased to 3000 sccm. In step 725, the Ar flow through manifold 14 is decreased to 1500 sccm and the Ar edge purge is increased to 3200 sccm and combined with an $H_2$ edge purge flow of 800 sccm. The pressure increase to 90 Torr is achieved during a 6 second period. Then, during bulk deposition step 730, the $WF_6$ flow is reintroduced with the process gas, the Ar carrier gas flow is reduced to 1000 sccm, the Ar edge purge is increased to 3600 sccm and process conditions are held for a predetermined period to complete deposition of the tungsten film.

In the second embodiment, the rate at which $WF_6$ and $H_2$ are flowed into the chamber during bulk deposition step 730 depends on the application in which the resulting tungsten film will be used. If used in a via-fill application where conformality properties are favored over resistance, $WF_6$ is introduced at a rate of 95 sccm and $H_2$ flow is maintained at 700 sccm. If however, the tungsten film is used for a gate structure, low resistivity is a primary concern and $WF_6$ flow is set to 36 sccm while $H_2$ flow is increased to 1800 sccm.

After bulk deposition step 730 is completed, a purge step 735 is used to purge residual $WF_6$ deposition gases from chamber 12. In this purge step, the $WF_6$ and $H_2$ gas flows are stopped and the Ar carrier gas flow is increased to 2700 sccm for 6 seconds. Also, the lower Ar edge purge flow is decreased to 2800 sccm and the $H_2$ edge purge flow is stopped.

Next, in step 740 an 1800 sccm flow of $H_2$ is introduced for 6 seconds, the wafer is dechucked (disengaged from vacuum clamping system 50) and the Ar edge purge flow is decreased to 500 sccm. In step 725, the throttle valve 37 is fully opened while the chamber is purged for 3 seconds, and in step 750, all gas flows are stopped while the chamber is evacuated.

The tungsten film deposited according to the above process has a resistivity of 8.5 $\mu\Omega$-cm at a thickness of 600 Å while the via-fill film has a resistivity of 9.0 $\mu\Omega$-cm at a similar thickness. The fluorine concentration of each is about $1\times10^{18}$ atoms/cm$^3$ and the boron concentration is less than $1\times10^{16}$ atoms/cm$^3$ (the detection limit of the secondary ion mass spectroscopy equipment used in these tests).

The process parameters set forth above with respect to the foregoing embodiments are optimized for one particular deposition process performed in a resistively heated WxZ chamber manufactured by Applied Materials that is outfitted for 200 mm wafers. In addition to varying processing parameters described above to deposit tungsten layers according to specific applications, a person of ordinary skill in the art will recognize that these preferred parameters are in part chamber specific and will vary if chambers of other design and/or volume are employed.

The parameters listed in the above described gate structure, preferred processes, and apparatus should not be limiting to the claims as described herein. One of ordinary skill in the art can also use parameters and conditions other than those described with respect to the preferred embodiment. As such, the above description is illustrative and not restrictive. For example, other dopants may be used to make the source and drain regions. Also other sources of nitrogen such as $N_2O$ can be used as the process gas, and other inert gases, such as helium can be used in place of argon. Furthermore, other process temperature and pressure values and other gas flow rates can be employed.

Although various embodiments which incorporate the teachings of the present invention have been shown and described in detail herein, those skilled in the art can readily devise many other varied embodiments that still incorporate these teachings.

What is claimed is:

1. A method of forming a gate electrode connection structure on a substrate in a processing chamber; said method comprising the steps of:

(A) depositing a tungsten nitride diffusion barrier onto a gate electrode by forming a plasma from a gaseous mixture comprising nitrogen gas and a tungsten-containing gas; and (B) depositing a tungsten film on top of said tungsten nitride diffusion barrier, wherein said tungsten nitride diffusion barrier and said tungsten film are deposited within the same processing chamber.

2. The method of claim 1, further comprising, prior to said step (A), the steps of:

(i) providing a first gaseous composition containing a hydrogen gas; and (ii) providing energy to said first gaseous composition to form a treatment plasma that treats an upper surface of said gate electrode.

3. The method of claim 2, wherein said first gaseous composition consists of hydrogen and nitrogen.

4. The method of claim 1, wherein said gaseous mixture includes tungsten hexafluoride.

5. The method of claim 1, wherein said gate electrode is fabricated of polysilicon.

6. The method of claim 1, wherein said gaseous mixture includes argon.

7. The method of claim 1 wherein, said tungsten film is deposited in step (B) by:

(i) providing a tungsten containing gaseous mixture to a deposition zone in said processing chamber;

(ii) maintaining said substrate at a sufficient temperature and said processing chamber at a sufficient pressure to cause a tungsten to be deposited onto said substrate.

8. The method of claim 7 wherein said substrate is maintained at a temperature of between 200° C. and 600° C.

9. The method of claim 7 wherein said chamber is maintained at a pressure of between 0.01 Torr to 760 Torr.

10. The method of claim 7 wherein said gaseous mixture in (i) of step (B) comprises tungsten hexafluoride.

11. The method of claim 7 wherein said gaseous mixture in (i) of step (B) further comprises a second gas chosen from the group consisting of hydrogen and nitrogen.

12. The method of claim 7 wherein said gaseous mixture in (i) of step (B) further comprises argon.

13. The method of claim 1 wherein, said tungsten film is deposited in step (B) by:
(i) placing a substrate in a deposition zone;
(ii) during a first deposition step,
  (a) flowing a process gas comprising a tungsten-containing source, a group III or V hydride and a reduction agent into said deposition zone, and
  (b) maintaining said deposition zone at or below a first pressure while maintaining other process variables at conditions suitable to deposit a first layer of the tungsten film on the substrate;
(iii) during a second deposition step after said first deposition step,
  (a) stopping the flow of said group III or V hydride into said deposition zone, and thereafter
  (b) increasing the pressure in said deposition zone to a second pressure above said first pressure while maintaining other process variables at conditions suitable for depositing a second layer of the tungsten film on the substrate.

14. The method of claim 13 wherein said second deposition step further comprises:
in step (iii)(a), stopping the flow of said tungsten-containing source along with the flow of said group III or V hydride, and
in step (iii)(b), after the pressure in said deposition zone is increased to said second pressure, reflowing said tungsten-containing source while maintaining other process variables at conditions suitable for depositing the second layer of the tungsten film on the substrate.

15. The method of claim 14 further comprising:
(iv) during a third deposition step, prior to said first deposition step, flowing a silicon-containing source into said chamber prior to flowing said tungsten-containing source into said chamber during said first deposition stage.

16. The method of claim 15 wherein a reducing agent is also flowed into said chamber during said third deposition step.

17. The method of claim 16 wherein said tungsten-containing source comprises $WF_6$, said group III or V hydride comprises $B_2H_6$ and said silicon-containing source comprises $SiH_4$.

18. The method of claim 17 wherein said reducing agent comprises $H_2$.

19. The method of claim 1 wherein, said tungsten film is deposited in step (B) by:
(i) placing a substrate in a deposition zone;
(ii) during a first deposition step,
  (a) flowing a process gas comprising a tungsten-containing source, diborane, a silane gas, a reduction agent and a carrier gas into the deposition zone, and
  (b) maintaining the deposition zone a pressure level below 50 Torr and at process conditions suitable for depositing a first layer of the tungsten film on the substrate; and
(iii) during a second deposition stage after said first deposition step,
  (a) stopping the flows of said tungsten-containing source, said diborane and said silane gas,
  (b) thereafter, increasing the pressure in the deposition zone to at least 50 Torr, and
  (c) between about 5 and 20 seconds after stopping the flows of said gases in step (iii)(a), restarting the flow of said tungsten-containing source to deposit a second layer of the tungsten film on the substrate.

20. The method of claim 19 further comprising a third deposition step, prior to said first deposition step, in which a process gas comprising a silane gas, a reduction agent and a carrier gas is flowed into the deposition zone.

21. The method of claim 19 wherein said tungsten-containing source comprises $WF_6$, said silane gas comprises $SiH_4$ and said reduction agent comprises $H_2$.

22. The method of claim 19 further comprising the step of, prior to the first deposition stage flowing a purge gas including $B_2H_6$ and an inert gas into said deposition zone.

23. The method of claim 22 further comprising the step of, prior to flowing said purge gas, flowing a silicon-containing source into the deposition zone.

24. A method of forming a gate electrode and a connection structure on a substrate in a processing chamber, said method comprising the steps of:
(a) forming a first insulating layer on a substrate;
(b) forming an aperture extending through said first insulating layer to said substrate;
(c) forming a second insulating layer over said substrate at a bottom of said aperture;
(d) forming a gate electrode over said second insulating layer;
(e) depositing a tungsten nitride diffusion barrier onto said gate electrode; and
(f) depositing a layer of tungsten on top of said tungsten nitride diffusion barrier, wherein said tungsten nitride diffusion barrier and said layer of tungsten are deposited within said processing chamber.

25. The method of claim 24, wherein said step (e) comprises the steps of:
(i) providing a first gaseous composition containing a hydrogen gas; and
(ii) providing energy to said first gaseous composition to form a treatment plasma that treats an upper surface of said gate electrode; and
(iii) depositing tungsten nitride upon said treated upper surface.

26. The method of claim 25, wherein said first gaseous composition consists of hydrogen and nitrogen.

27. The method of claim 25, wherein said depositing step (iii) further comprises forming a deposition plasma from a gaseous mixture comprising nitrogen gas and a tungsten-containing gas.

28. The method of claim 27, wherein said gaseous mixture includes tungsten hexafluoride.

29. The method of claim 24, wherein said layer of tungsten is deposited in step (f) by:
(i) providing a tungsten-containing gaseous mixture to a deposition zone in said processing chamber; and
(ii) maintaining said substrate at a sufficient temperature and said processing chamber at a sufficient pressure to cause a tungsten to be deposited onto said substrate.

30. The method of claim 29, wherein said substrate is maintained at a temperature of between 200° C. and 600° C.

31. The method of claim 29, wherein said chamber is maintained at a pressure of between 0.01 Torr to 760 Torr.

32. The method of claim 29, wherein said tungsten-containing gaseous mixture comprises tungsten hexafluoride.

33. The method of claim 32, wherein said tungsten-containing gaseous mixture further comprises a hydrogen-containing gas.

34. The method of claim 33, wherein said tungsten-containing gaseous mixture further comprises argon.

* * * * *